United States Patent
Itoh et al.

(10) Patent No.: US 6,810,057 B1
(45) Date of Patent: Oct. 26, 2004

(54) SEMICONDUCTOR DEVICE AND OPTICAL PICKUP DEVICE

(75) Inventors: Kunio Itoh, Uji (JP); Nobuyuki Uemura, Takatsuki (JP); Masaaki Yuri, Ibaraki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 188 days.

(21) Appl. No.: 09/718,568

(22) Filed: Nov. 22, 2000

(30) Foreign Application Priority Data

Nov. 25, 1999 (JP) .......................................... 11-333784

(51) Int. Cl.⁷ ................................................. H01S 5/00
(52) U.S. Cl. ........................... 372/50; 372/43; 372/44; 372/45
(58) Field of Search .......................... 372/50, 43, 46, 372/369, 112

(56) References Cited

U.S. PATENT DOCUMENTS

| | | | | |
|---|---|---|---|---|
| 4,893,296 A | * | 1/1990 | Matsumoto et al. | ... 369/112.27 |
| 5,235,589 A | * | 8/1993 | Yokomori et al. | ..... 369/112.27 |
| 5,426,630 A | * | 6/1995 | Yang | ..................... 369/112.28 |
| 5,478,438 A | | 12/1995 | Nakanishi et al. | |
| 5,479,426 A | | 12/1995 | Nakanishi et al. | |
| 5,517,479 A | | 5/1996 | Nakanishi et al. | |
| 5,744,857 A | * | 4/1998 | Yamamoto | ................... 257/622 |
| 5,787,058 A | * | 7/1998 | Choi | ....................... 369/44.23 |
| 5,956,312 A | * | 9/1999 | Ishihara | ................. 369/112.21 |
| 6,091,689 A | * | 7/2000 | Taniguchi et al. | ..... 369/112.21 |
| 6,267,515 B1 | * | 7/2001 | Okuda et al. | .................. 385/88 |
| 6,324,149 B1 | * | 11/2001 | Mifune et al. | ......... 369/112.01 |
| 6,480,639 B2 | * | 11/2002 | Hashimoto et al. | ........... 385/14 |

| 2003/0168653 A1 | * | 9/2003 | Tsujimura et al. | ............ 257/14 |

FOREIGN PATENT DOCUMENTS

| JP | 9-120568 | 5/1997 |
|---|---|---|
| JP | 10-64107 | 3/1998 |
| JP | 11-39693 | 2/1999 |
| JP | 11-149652 | 6/1999 |
| JP | 11-161993 | 6/1999 |

OTHER PUBLICATIONS

Jun. 28, 1999, News Reports from Nikkei Electronics; (No. 746), p 29–30, and its English translation.
Oct. 1999, Publication by Sony, Dual Wavelength Laser Coupler and Laser Coupler Group, Optical integrated device supports optical disc market, and its English translation.

\* cited by examiner

*Primary Examiner*—Don Wong
*Assistant Examiner*—Dung Nguyen
(74) *Attorney, Agent, or Firm*—Merchant & Gould P.C.

(57) ABSTRACT

A semiconductor device having a plurality of semiconductor laser elements is provided, which is capable of reducing an interval of emission points between the semiconductor laser elements and also capable of preventing heat generated by a semiconductor laser element from affecting other semiconductor elements. A concave portion is formed on a silicon substrate, and a protrusion of a quadrangular truncated pyramidal shape consisting of slanted faces of a (1 1 1) plane, a (1 $\bar{1}$ 1) plane, a ($\bar{1}$ 1 1) plane and a ($\bar{1}$ 1 1) plane is formed near the center of the concave portion by using the silicon process. Among these slanted faces, a (1 1 1) outer face and a (1 1 1) inner face are determined to be reflecting mirror surfaces. The semiconductor laser elements respectively are fixed on small protrusions formed on the concave portion, and a photodetector for receiving light beams L1' and L2' returning from an optical disc is disposed on a top face of the protrusion.

20 Claims, 12 Drawing Sheets

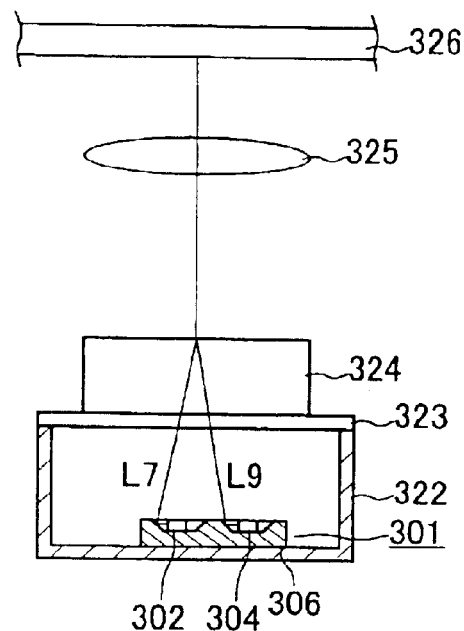
FIG. 9
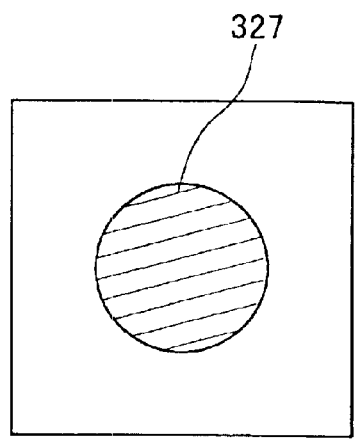
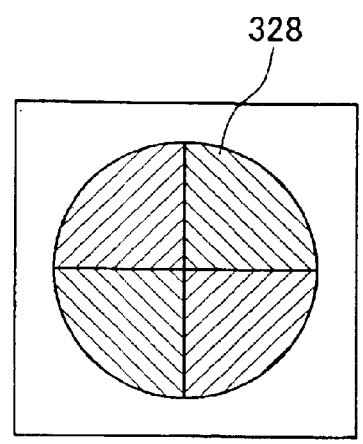
FIG. 10A              FIG. 10B

SEMICONDUCTOR DEVICE AND OPTICAL PICKUP DEVICE

TECHNICAL FIELD OF THE INVENTION

The present invention relates to a semiconductor device and an optical pickup device used for optical information processing, optical measurement, optical communication and the like.

BACKGROUND OF THE INVENTION

A conventionally known semiconductor device integrated with two light sources has either a hybrid integration in which a red semiconductor laser element and an infrared semiconductor laser element are arranged independently inside an optical-pickup or a monolithic integration in which a red semiconductor laser structure and an infrared semiconductor laser structure are integrated on the same substrate.

These two examples of integration will be described below.

First, a conventional semiconductor device with a monolithic integration of two light sources will be described schematically by referring to FIG. 14.

As shown in FIG. 14, in this semiconductor device 1, on top of a photodiode IC 2, a semiconductor laser element 3 emitting a laser beam L11 having a wavelength of about 650 nm, for example, used for DVD, a semiconductor laser element 4 emitting a laser beam L12 having a wavelength of about 780 nm, for example, used for CD, a photodetector 5 having a plurality of sensor elements 5a to 5d and a micro-prism 6 functioning as a reflecting mirror are integrated. Furthermore, on the upper side of the micro-prism 6, a hologram plate 7 is disposed for dividing a light beam returning from an optical recording medium (not shown) such as an optical disc into the zero-order light, the + first-order light, and the − first-order light and allowing them to enter the sensor elements 5a to 5d (See JP11 (1999)-149652A). In addition, as for the semiconductor laser elements 3, 4, those formed on the same LOP 8 are known (Nikkei Electronics, the Jun. 28, 1999 Issue, pages 29 to 30).

Next, a conventional semiconductor device with a hybrid integration of two light sources will be described schematically by referring to FIG. 15.

As shown in FIG. 15, in this semiconductor device 9, on top of a substrate 10, a semiconductor laser element 11 emitting a laser beam L13 having a wavelength of about 650 nm, for example, used for DVD, a semiconductor laser element 12 emitting a laser beam L14 having a wavelength of about 780 nm, for example, used for CD, a plurality of photodetectors 13, 14 and a micro-prism 15 functioning as a reflecting mirror are integrated. Moreover, on the upper side of the micro-prism 15, an optical element (not shown) is disposed for allowing light beams L13', L14' returning from an optical recording medium (not shown) such as an optical disc to enter the photodetector 13, 14 (See JP9 (1997)-120568A, JP10(1998)-64107A, JP11 (1999)-39693A, JP11 (1999)-161993A). In addition, the semiconductor laser elements 11, 12 are mounted respectively on the substrate 10 via mounts 17, 18.

However, the conventional configurations described above had the following problems.

First, with regard to the conventional semiconductor device with a monolithic integration of two light sources, the semiconductor laser element 3 and the semiconductor laser element 4 are arranged next to each other in such a manner that the emitting end faces of the lasers are facing the same direction. Therefore, it was difficult to reduce the interval between the emission points of the semiconductor laser element 3 and the semiconductor laser element 4 to 100 μm or less. As a result, the red laser and the infrared laser respectively emitted from the two semiconductor laser elements 3, 4 were affected differently from the optical element, so that one of the semiconductor laser elements suffered from deterioration of its operating characteristics. In particular, when the semiconductor laser element 3 and the semiconductor laser element 4 are arranged close to each other and one of the two semiconductor laser elements 3, 4 is operated with a high power of 30 mW or higher, heat generated in one of the semiconductor laser elements affects the other semiconductor laser element, which causes the characteristics of the semiconductor laser elements to deteriorate.

Furthermore, with regard to the conventional semiconductor device with a hybrid integration of two light sources, the micro-prism 15 is arranged between the semiconductor laser element 11 and the semiconductor laser element 12. Therefore, when the location of the micro-prism 15 is shifted from the predetermined position, the optical paths of the laser beams L13, L14 emitted from the semiconductor laser elements 11, 12 respectively are shifted. As a result, according to this amount of shifting, an apparent interval between the emission points of the semiconductor laser element 11 and the semiconductor laser element 12 (hereinafter, reference to "interval of emission points" includes "apparent interval of emission points") varied, which made it difficult to reduce the interval of the emission points.

Moreover, the conventional semiconductor device described above is configured such that the semiconductor laser elements are mounted via a mount such as the LOP 8, so that the interval of the emission points varied according to the uneven thickness of the mount, which made it difficult to reduce the interval of the emission points.

SUMMARY OF THE INVENTION

It is an object of the present invention to solve the conventional problems described above by providing a semiconductor device and an optical pickup device, which are capable of reducing an interval of emission points between a plurality of semiconductor laser elements and also capable of preventing heat generated when a semiconductor laser element is operated with a high power from affecting other semiconductor elements.

To achieve the above object, a configuration of a semiconductor device of the present invention includes a substrate, a protrusion having a plurality of side faces formed on the substrate by processing the substrate, and a plurality of semiconductor laser elements disposed on the substrate, wherein the plurality of semiconductor laser elements is arranged such that each end face thereof is opposed to a different side face of the protrusion. According to the configuration of this semiconductor device, the protrusion having a plurality of side faces is formed on the substrate, so that a micro-prism is no longer necessary. Furthermore, the plurality of semiconductor laser elements can be arranged on a straight line, so that an interval of emission points between the plurality of semiconductor laser elements can be reduced. In addition, since the plurality of semiconductor laser elements is arranged such that each end face thereof is opposed to a different side face of the protrusion, heat generated when a semiconductor laser element is operated with a high power can be prevented from affecting other semiconductor elements. As a result, it is possible to prevent the characteristics of the semiconductor laser elements from deteriorating.

Furthermore, in the configuration of the semiconductor device of the present invention, it is preferable that the protrusion is formed into a truncated pyramidal shape, and that a photodetector is disposed on a top face of the protrusion. According to this preferred configuration, the photodetector can be positioned in one place, so that the semiconductor device can be miniaturized.

Moreover, in the configuration of the semiconductor device of the present invention, it is preferable that the semiconductor device further includes a plurality of small protrusions formed on the substrate by processing the substrate, and that a semiconductor laser element is mounted on each of the small protrusions. According to this preferred configuration, particularly when the semiconductor laser elements are mounted p-side down, it is possible to prevent a part of the laser beams emitted from the end faces of the semiconductor laser elements from being blocked by the surface of the substrate.

Furthermore, in the configuration of the semiconductor device of the present invention, it is preferable that a groove is formed between the semiconductor laser element and the side face of the protrusion on the substrate. According to this preferred configuration, it is possible to prevent a part of the laser beams emitted from the end faces of the semiconductor laser elements from being blocked by the surface of the substrate.

Moreover, in the configuration of the semiconductor device of the present invention, it is preferable that the protrusion has four side faces having an angle between 40° and 50° with respect to a principal plane of the substrate, and that the semiconductor laser elements are arranged such that emitting end faces for main beams are opposed to the side faces of the protrusion. According to this preferred configuration, the main beams emitted from the semiconductor laser elements can be reflected at the side faces of the protrusion and move in the direction perpendicular to the substrate.

Furthermore, in the configuration of the semiconductor device of the present invention, it is preferable that the substrate is a silicon substrate, and that the principal plane of the substrate is a (1 0 0) plane inclined at an angle in the range between 5° and 15° in a <1 $\bar{1}$ 0> direction, and that one of the side faces of the protrusion opposed to the emitting end faces for the main beams of the semiconductor laser elements is a (1 1 1) plane. According to this preferred configuration, it is possible to make the incident angle formed by the main beam of the semiconductor laser element with the side face of the protrusion become closer to 45°.

Moreover, in the configuration of the semiconductor device of the present invention, it is preferable that the substrate is a silicon substrate, and that the principal plane of the substrate is a (5 1 1) plane inclined at an angle in the range between 1° and 11° in a <1 $\bar{1}$ 0> direction, and that one of the side faces of the protrusion opposed to the emitting end faces for the main beams of the semiconductor laser elements is a (1 1 1) plane. According to this preferred configuration, it is possible to make the incident angle formed by the main beam of the semiconductor laser element with the side face of the protrusion become closer to 45°.

Furthermore, in the configuration of the semiconductor device of the present invention, it is preferable that the semiconductor device further includes a concave portion having a plurality of side faces formed on the substrate by processing the substrate, and that the protrusion and the plurality of semiconductor laser elements are disposed inside the concave portion. Furthermore, in this case, it is preferable that the plurality of semiconductor laser elements is arranged such that each end face on the opposite side of the end faces opposed to the side faces of the protrusion is opposed to a different side face of the concave portion. In this case, furthermore, it is preferable that a main beam is emitted from one end face of the semiconductor laser element and a monitor light beam is emitted from the other end face thereof, and that a monitoring photodetector for receiving the monitor light beam is provided on the side face of the protrusion or the side face of the concave portion opposed to the emitting end face for the monitor light beam. According to this preferred configuration, the power of the main beam emitted from the semiconductor laser element can be controlled. Furthermore, in this case, it is preferable that the photodetector is disposed on the periphery of the concave portion. According to this preferred configuration, a plurality of photodetectors can be arranged, so that the light-receiving sensitivity of the semiconductor device can be improved. In this case, moreover, it is preferable that the photodetector has light-receiving areas divided into a plurality of portions. According to this preferred configuration, by carrying out the calculation of signals in the plurality of divided light-receiving areas, a tracking error detection can be performed with high accuracy. Moreover, in this case, the photodetector is divided in the direction parallel to the end face of the semiconductor laser element. According to this preferred configuration, even if the positions of the semiconductor laser elements are shifted from the predetermined positions, it is possible to have the quantity of the return light beams entering the photodetector scarcely change. Moreover, in this case, it is preferable that a groove is formed between the semiconductor laser element and the side face of the concave portion on the substrate. Also, in this case, it is preferable that the substrate is a silicon substrate, and that a bottom face of the concave portion is a (1 0 0) plane inclined at an angle in the range between 5° and 15° in a <1 $\bar{1}$ 0> direction, and that one of the side faces of the concave portion opposed to the emitting end faces of the main beams of the semiconductor laser elements is a (1 1 1) plane. Furthermore, in this case, it is preferable that the substrate is a silicon substrate, and that a bottom face of the concave portion is a (5 1 1) plane inclined at an angle in the range between 1° and 11° in a <1 $\bar{1}$ 0> direction, and that one of the side faces of the concave portion opposed to the emitting end faces for the main beams of the semiconductor laser elements is a (1 1 1) plane.

Furthermore, a first configuration of an optical pickup device of the present invention is characterized in that a plurality of semiconductor laser elements, a plurality of photodetectors and a plurality of reflecting surfaces are disposed on the same substrate, and each of the semiconductor laser elements further includes a semiconductor device arranged such that each end face thereof is opposed to a different reflecting surfaces and a hologram element is positioned along an optical axis of a light beam emitted from the semiconductor laser element toward an optical recording medium. According to the first configuration of the optical pickup device of the present invention, the semiconductor device itself can be miniaturized, so that the miniaturization of the optical pickup device can be achieved.

Moreover, a second configuration of an optical pickup device of the present invention includes a semiconductor device having a plurality of semiconductor laser elements and a hologram element positioned along an optical axis of a light beam emitted from the semiconductor laser elements toward an optical recording medium, wherein the semiconductor device of the present invention is used as the semiconductor device.

Furthermore, in the first or the second configurations of the optical pickup device of the present invention, it is preferable that the hologram element has a plurality of diffraction gratings. According to this preferred configuration, the return light beams from the optical recording medium originated from each of the plurality of semiconductor laser elements can be made to enter each of the plurality of photodetectors.

BRIEF DESCRIPTION OF THE DRAWINGS

FIG. 9 is a sectional view showing an optical pickup device according to the third embodiment of the present invention.

FIG. 10A is a view of a hologram element used for an optical pickup device according to the third embodiment of the present invention, seen from the side facing a semiconductor device; FIG. 10B is a view of the hologram seen from the side facing an optical disk.

PREFERRED EMBODIMENTS OF THE INVENTION

Hereinafter, the present invention will be described more specifically by using embodiments.

Additionally, the reference drawings are all schematic drawings and donot represent the actual scale.
[First Embodiment]

Figure 1:
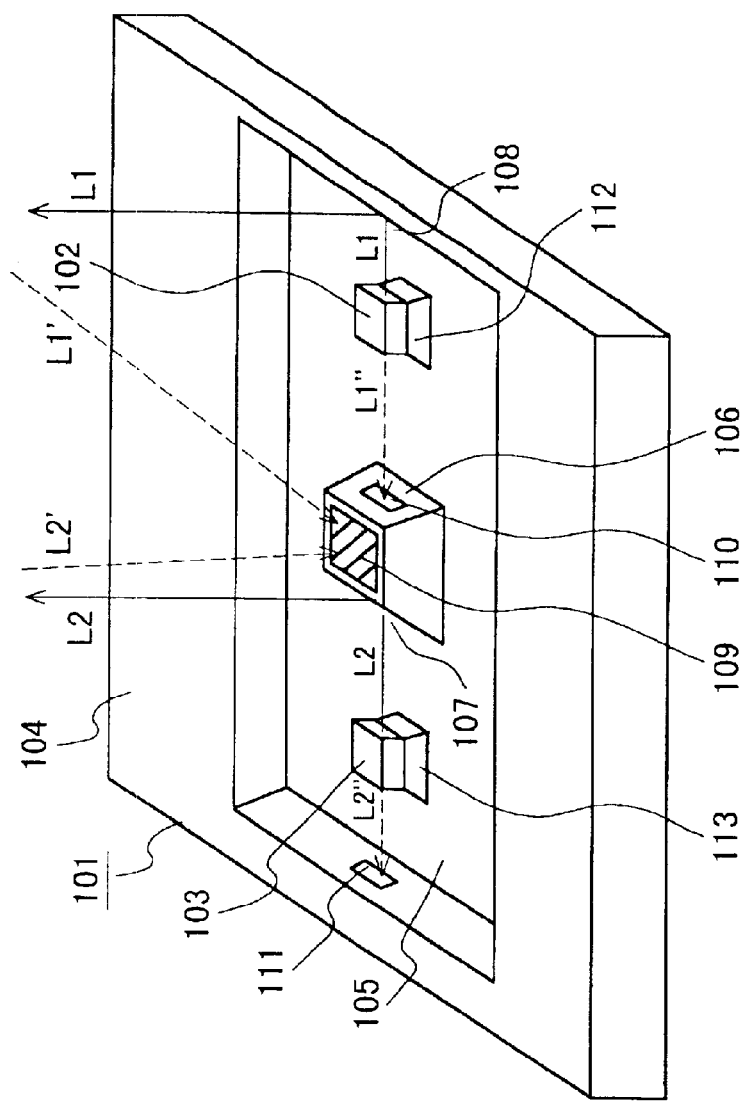
FIG. 1 is a perspective view showing a semiconductor device according to a first embodiment of the present invention.
Figure 2:
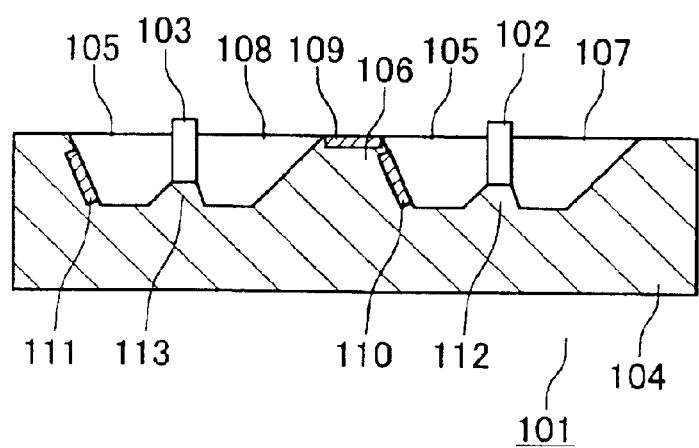
FIG. 2 is a sectional view showing a semiconductor device according to the first embodiment of the present invention.

FIG. 1 is a perspective view showing a semiconductor device according to a first embodiment of the present invention. FIG. 2 is a sectional view of the semiconductor device illustrated in FIG. 1, taken on the plane perpendicular to the principal plane of a silicon substrate 104 including semiconductor laser elements 102, 103.

As shown in FIG. 1 and FIG. 2, in a semiconductor device 101 of the present embodiment, the silicon substrate 104 provided with the principal plane of a (1 0 0) plane having an off angle of 9.7° (hereinafter referred to as "(1 0 0) 9.7° off plane") is used as the substrate.

In the principal plane of the silicon substrate 104, a concave portion 105 of 200 μm in depth is formed by the silicon process. The concave portion 105 includes a square bottom face, each side having a length of 1.5 mm, and four slanted faces surrounding the bottom face. The bottom face included in the concave portion 105 is a (1 0 0) 9.7° off plane, and the four sides forming the bottom face are parallel to the <1 1 0> direction or to the <1 $\bar{1}$ 0> direction. Furthermore, the four slanted faces included in the concave portion 105 (hereinafter, these slanted faces will be referred to as "outside faces") are respectively a (1 1 1) plane, a (1 $\bar{1}$ 1) plane, a ($\bar{1}$ $\bar{1}$ 1) plane and a ($\bar{1}$ 1 1) plane (hereinafter, these planes will be referred to as "(1 1 1) outer face", "(1 $\bar{1}$ 1) outer face" and so forth).

A protrusion 106 having a quadrangular truncated pyramidal shape of 200 μm in height is formed near the center of the concave portion 105 by using the silicon process. The protrusion 106 includes a square bottom face, four slanted faces and a top face. Four sides forming the bottom face included in the protrusion 106 are parallel to the <1 1 0> direction or to the <1 $\bar{1}$ 0> direction. The four slanted faces included in the protrusion 106 (hereinafter, these slanted faces will be referred to as "inside faces") are respectively a (1 1 1) plane, a (1 $\bar{1}$ 1) plane, a ($\bar{1}$ $\bar{1}$ 1) plane and a ($\bar{1}$ 1 1) plane (hereinafter, these planes will be referred to as "(1 1 1) inner face", "(1 $\bar{1}$ 1) inner face" and so forth). The top face included in the protrusion 106 is a (1 0 0) 9.7° off plane, and each side forming the top face is 50 μm in length.

Among the outside faces and the inside faces described above, the (1 1 1) outer face and the (1 1 1) inner face are reflecting mirror surfaces 107, 108. Here, the concave portion 105 and the protrusion 106 are formed by using the silicon process, so that the reflecting mirror surfaces 107, 108 can be produced with an accuracy of 1 μm or less. This fact also applies to the second and third embodiments to be described later. On top of small protrusions 112, 113 formed on the concave portion 105 by using the silicon process, semiconductor laser elements 102, 103 are fixed respectively. The semiconductor laser elements 102, 103 are arranged such that their front end faces are parallel to the <1 1 0> direction and are opposed to the reflecting mirror surfaces 107, 108 respectively. Furthermore, on the top face of the protrusion 106, a photodetector 109 for receiving light beams L1' and L2' returning from an optical disc is provided, and on the ($\bar{1}$ $\bar{1}$ 1) inner face and on the ($\bar{1}$ $\bar{1}$ 1) outer face respectively, monitoring photodetectors 110, 111 are disposed. The monitoring photodetectors 110, 111 respectively are disposed to monitor the power of monitor light beams L1", L2" emitted from the back end faces of the semiconductor laser elements 102, 103 and to control the power of the main beams emitted from the front end faces of the semiconductor laser elements 102, 103. In addition, the shape of the small protrusions 112, 113 is similar to that of the protrusion 106, and each small protrusion is 50 μm in height.

As shown in FIG. 2, the semiconductor laser elements 102, 103 are fixed by a solder material (not shown) such that the sides of the crystal growth faces (the sides of the emission parts) face downward. Moreover, the two semiconductor laser elements 102, 103 are arranged such that the respective emitting points of the beams are lined on a straight line.

In the above configuration of the semiconductor device, the (1 1 1) outer face and the (1 1 1) inner face are inclined at an angle of 45o with the bottom face of the concave portion 105. The concave portion 105, the protrusion 106 and the small protrusions 112, 113 described above can be formed easily by forming an oxide etching mask on the silicon substrate 101 and performing an etching using an aqueous solution of potassium hydroxide or a solution effecting anisotropic etching such as ethylenediamine.

An Au film (not shown) with a thickness between 300 nm and 500 nm is formed on the reflecting mirror surfaces 107, 108, and the reflectivity of the reflecting mirror surfaces 107, 108 is 90% or higher. According to this configuration, main beams L1, L2 emitted from the front end faces of the semiconductor laser elements 102, 103 in the horizontal direction respectively are reflected at the reflecting mirror surfaces 107, 108 and move in the direction of an optical disc (not shown) located in the vertical direction or almost in the vertical direction with respect to the principal plane of the silicon substrate 104, and are then reflected by the optical disc.

According to the present embodiment, the two semiconductor laser elements 102, 103 can be arranged on a straight line, so that the interval of the emission points between the semiconductor laser element 102 and the semiconductor laser element 103 can be reduced. Furthermore, since the two semiconductor laser elements 102, 103 are formed in different places on the silicon substrate 104 with the protrusion 106 located between them, even if one semiconductor laser element is operated with a high power of 30 W or higher, heat generated thereby does not easily affect the other semiconductor laser element. As a result, the characteristic deterioration of the semiconductor laser elements can be prevented.

In particular, it is possible to make the incident angle formed by the main beam L1 of the semiconductor laser element 102 with the side face of the concave portion 105 and the incident angle formed by the main beam L2 of the semiconductor laser element 103 with the side face of the protrusion 106 respectively become closer to 45°.

Furthermore, particularly by fixing the semiconductor laser elements 102, 103 respectively onto the small protrusions 112, 113, and particularly when the semiconductor laser elements 102, 103 are mounted p-side down, that is, when the semiconductor laser elements 102, 103 are mounted such that, for example, the p-side electrodes of the semiconductor laser elements 102, 103 are facing the small protrusions 112, 113, it is possible to prevent a part of the main beams emitted from the front end faces of the semiconductor laser elements 102, 103 from being blocked by the bottom face of the concave portion 105.

As examples of the semiconductor laser elements 102, 103 used in the present embodiment, there are an AlGaAs-type laser with a wavelength of 780 nm, an AlGaInP-type laser with a wavelength of 650 nm and a GaN-type laser with a wavelength of 420 nm. By using any two lasers among these, a dual wavelength semiconductor laser device can be obtained. Furthermore, two semiconductor lasers with the same wavelength, for example, an AlGaInP-type high power laser and an AlGaInP-type self-oscillation laser both having a wavelength of 650 nm also may be used.

Figure 3:
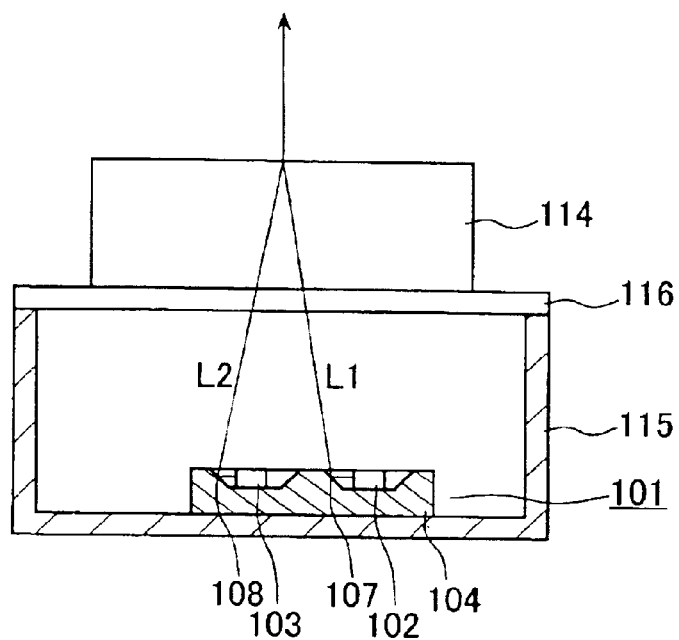
FIG. 3 is a sectional view showing the state of main beams emitted from a semiconductor device according to the first embodiment of the present invention.

By referring to FIG. 3, will be described the reduction of the interval of the emission points between the semiconductor laser element 102 and the semiconductor laser element 103, i.e. the apparent interval of the emission points by arranging the two semiconductor laser elements 102, 103 on a straight line. In addition, the semiconductor device 101 in FIG. 3 is the same as that shown in FIG. 1, which is mounted inside a case 115 and sealed with a cover glass 116. Moreover, a hologram element 114 is mounted on the cover glass 116.

As shown in FIG. 3, the main beams L1, L2 respectively emitted from the semiconductor laser elements 102, 103 in the horizontal direction are reflected at the reflecting mirror surfaces 107, 108 respectively and move in the vertical direction or almost in the vertical direction. At this time, by suitably selecting the respective angles of the laser beams respectively entering the reflecting mirror surfaces 107, 108, the laser beams being emitted from the semiconductor laser elements 102, 103, for example, the two main beams L1, L2, can be made to intersect at one point in the hologram element 114, in other words, the interval of the emission points between the semiconductor laser element 102 and the semiconductor laser element 103 can be made to become zero in the hologram element 114.

Next, an optical pickup device including the semiconductor device 101 as the semiconductor laser device will be described with reference to FIG. 4.

Figure 4:
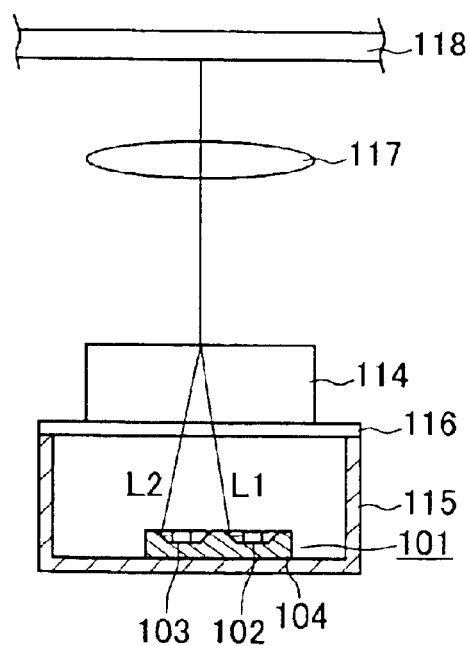
FIG. 4 is a sectional view showing an optical pickup device according to the first embodiment of the present invention.

As shown in FIG. 4, in this optical pickup device, the hologram element 114 and a collimator lens 117 are arranged in this order along the main beams L1, L2 emitted from the semiconductor device 101. The hologram element 114 and the collimator lens 117 are arranged such that the main beams L1, L2 are focused on an optical disc 118. The light beam returning from the optical disc 118 passes through the collimator lens 117 and the hologram element 114 in this order and enters the semiconductor device 101 again. This light beam is detected by the photodetector 109 (See FIG. 1 and FIG. 2) as information of the optical disc 118.

In the configuration of this optical pickup device, the semiconductor device 101 capable of reducing the interval of the emission points between the plurality of semiconductor laser elements is used, so that the optical system such as the lens can be simplified even more. As a result, inexpensive optical pickup devices can be realized.

Figure 5:
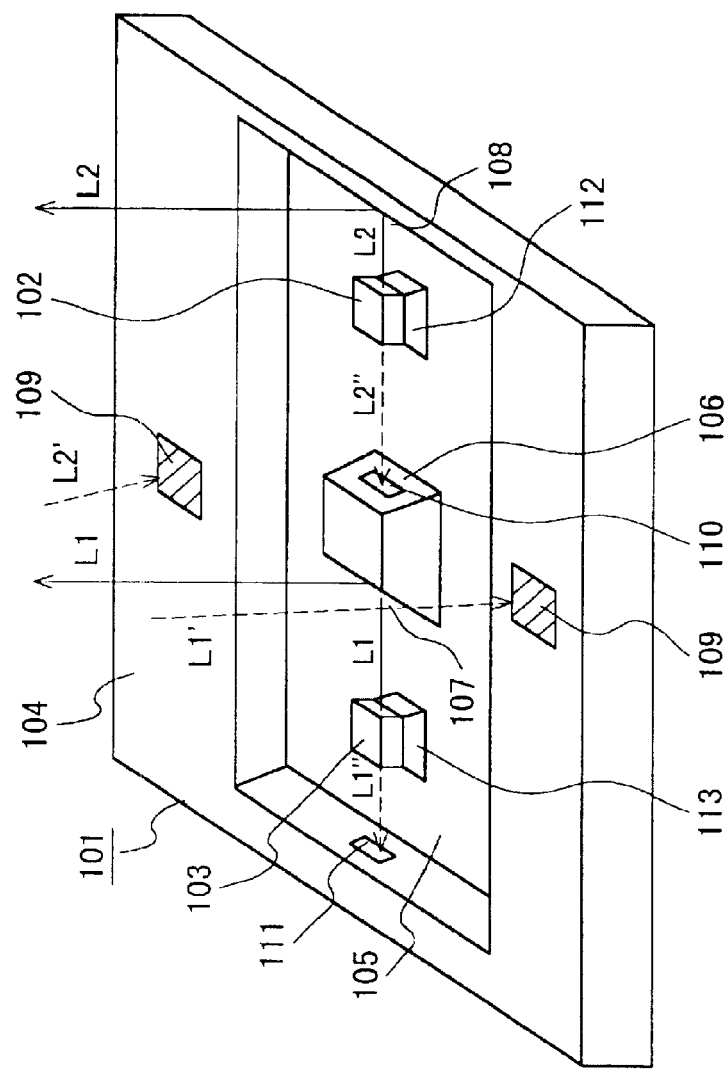
FIG. 5 is a perspective view showing another example of a semiconductor device according to the first embodiment of the present invention.

Additionally, in the present embodiment, the photodetector 109 for receiving the light beam returning from the optical disc is disposed on the top face of the protrusion 106. However, it is not necessarily limited to this configuration. For example, as shown in FIG. 5, the photodetector 109 may be disposed in the periphery of the concave portion 105 in the silicon substrate 104.

Furthermore, in the present embodiment, the semiconductor laser elements 102, 103 are fixed such that the sides of the crystal growth faces (the sides of the emission parts) face downward, but it is also possible to fix them such that the sides of the crystal growth faces (the sides of the emission parts) face upward. However, if the semiconductor laser elements 102, 103 are fixed such that the sides of the crystal growth faces (the sides of the emission parts) face upward, the unevenness in thickness of the semiconductor laser elements 102, 103 themselves increases to 20 $\mu$m, and the positions of the emission points are shifted in accordance with this increase. Therefore, it is desirable to fix the semiconductor laser elements 102, 103 such that the sides of the crystal growth faces face downward. If the semiconductor laser elements 102, 103 are fixed such that the sides of the crystal growth faces face downward, the unevenness in the positions of the emission points, i.e. the interval of the emission points can be suppressed, within the unevenness of the crystal growth films of the semiconductor laser elements 102, 103 (about 2 $\mu$m), so that it is more effective. In this case, instead of the small protrusions 112, 113, if a groove is formed between the front end faces of the semiconductor laser elements 102, 103 and the reflecting mirror surfaces 107, 108, it is possible to prevent a part of the main beams emitted from the front end faces of the semiconductor laser elements 102, 103 from being blocked by the bottom face of the concave portion 105. This fact also applies to the second and third embodiments to be described later.

Furthermore, in this embodiment, the principal plane of a (1 0 0) plane having an off angle of 9.7° with respect to the <1 $\bar{1}$ 0> direction as the axis is used. However, the same effect can be obtained by using a (1 0 0) plane having an off angle between 5 and 15o as the principal plane, because the inclination of the reflecting mirror surfaces 107, 108 with respect to the surface of the silicon substrate 104 can be kept within the range of 40°≦θ≦50°, and the reflecting mirror surfaces 107, 108 inclined at an angle of about 45° can be obtained. Furthermore, the same effect can be obtained by using a silicon substrate that is equivalent to the silicon substrate 104, for example, a substrate provided with the principal plane of a (5 1 1) plane having an off angle between 1° and 11° with respect to the <1 1̄ 0>direction as the axis or other equivalent substrates having an off angle determined suitably from the crystal faces. This fact also applies to the second and third embodiments to be described later.

[Second Embodiment]

Figure 6:
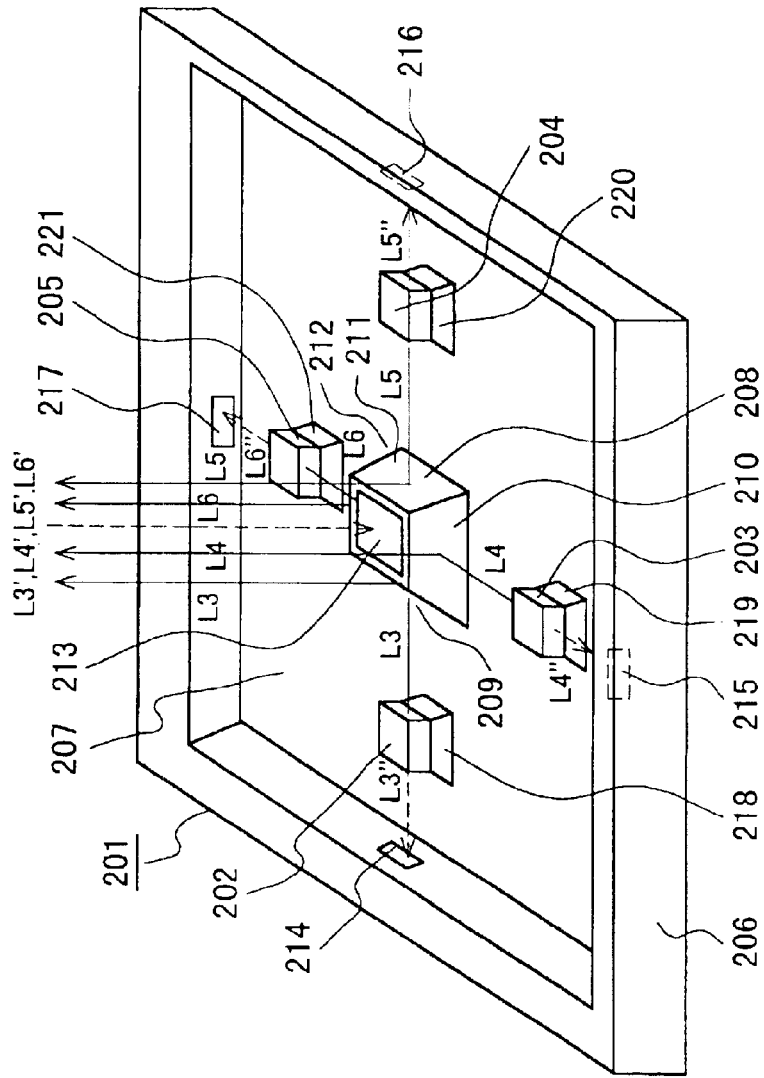
FIG. 6 is a perspective view showing a semiconductor device according to a second embodiment of the present invention.

FIG. 6 is a perspective view showing a semiconductor device according to a second embodiment of the present invention.

As shown in FIG. 6, in a semiconductor device 201 of the present embodiment, a concave portion 207 and a protrusion 208 having the same size as in the first embodiment are formed on the principal plane of a silicon substrate 206, which is a (1 0 0) 9.7° off plane.

A (1 1 1) inner face included in the protrusion 208 and three planes having an angle of 45° with respect to the (1 0 0) 9.7° off plane (hereinafter, these planes will be referred to as an "α inner face", a "β inner face" and a "γ inner face" seen counterclockwise from the upper side of the protrusion 208) function as reflecting mirror surfaces 209, 210, 211 and 212. On top of small protrusions 218, 219, 220, and 221 formed on the concave portion 207, semiconductor laser elements 202, 203, 204, and 205 are fixed respectively. The semiconductor laser elements 202, 203, 204 and 205 are arranged such that their front end faces respectively are parallel to four sides forming the bottom face of the protrusion 208 and are opposed to the reflecting mirror surfaces 209, 210, 211, 212 respectively. On the top face of the protrusion 208, a photodetector 213 for receiving light beams L3', L4', L5' and L6' returning from an optical disc is provided. On the (1 1 1) outer face included in the concave portion 207 and on three planes having an angle of 45° with respect to the (1 0 0) 9.7° off plane (hereinafter, these planes will be referred to as an "α outer face", a "β outer face" and a "γ outer face" seen counterclockwise from the upper side of the concave portion 207) respectively, monitoring photodetectors 214, 215, 216 and 217 are provided. The monitoring photodetectors 214, 215, 216 and 217 respectively are disposed to monitor the power of monitor light beams L3", L4", L5" and L6" emitted from the back end faces of the semiconductor laser elements 202, 203, 204 and 205 and to control the power of the main beams emitted from the front end faces of the semiconductor laser elements 202, 203, 204 and 205.

Figure 7:
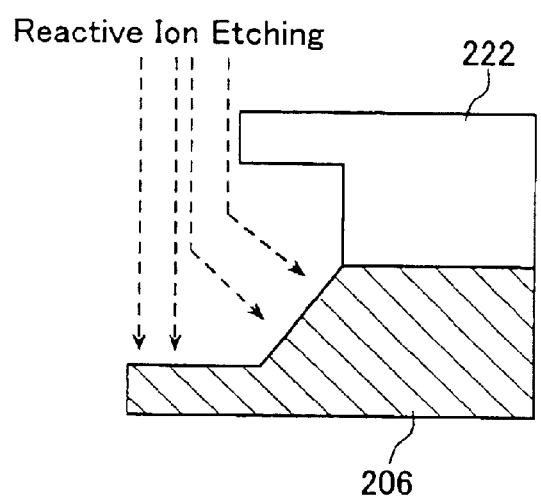
FIG. 7 is a sectional view showing the state of reactive ion etching used for the second embodiment of the present invention.

In addition, the protrusion 208 and the small protrusions 218, 219, 220 and 221 can be formed, for example, as shown in FIG. 7, by forming a mask 222 on the silicon substrate 206 and performing a reactive ion etching (RIE: Reactive Ion Etching). Furthermore, the shape of the small protrusions 218, 219, 220 and 221 is similar to that of the protrusion 208, and each small protrusion is 50 μm in height.

The semiconductor laser elements 202, 203, 204 and 205 are fixed by a solder material (not shown) such that the sides of the crystal growth faces (the sides of the emission parts) face downward.

As in the first embodiment, an Au film (not shown) with a thickness between 300 nm and 500 nm is formed on the reflecting mirror surfaces 209, 210, 211 and 212, and the reflectivity of the reflecting mirror surfaces 209, 210, 211 and 212 is 90% or higher. According to this configuration, main beams L3, L4, L5 and L6 emitted from the front end faces of the semiconductor laser elements 202, 203, 204 and 205 in the horizontal direction respectively are reflected at the reflecting mirror surfaces 209, 210, 211 and 212 and move in the direction of an optical disc (not shown) located in the vertical direction or almost in the vertical direction to the principal plane of the silicon substrate 206, and then are reflected by the optical disc. Then, the light beams L3', L4', L5' and L6' returning from the optical disc enter the photodetector 213, and they are detected as signals.

According to the present embodiment, the semiconductor laser element 202 and the semiconductor laser element 204 can be arranged on a straight line, and the semiconductor laser element 203 and the semiconductor laser element 205 can be arranged on a straight line. Thus, the interval of the emission points between the plurality of semiconductor laser elements can be reduced.

In particular, it is possible to make the incident angles formed by the main beams L3, L4, L5 and L6 of the semiconductor laser elements 202, 203, 204 and 205 with the side faces of the protrusion 208 become closer to 45° respectively.

Furthermore, by mounting the photodetector 213 on the top face of the protrusion 208, the area of the silicon substrate 204 where the semiconductor laser elements 202, 203, 204, 205 and the photodetector 213 are arranged can be reduced. As a result, the optical pickup device can be miniaturized.

As examples of the semiconductor laser elements 202, 203, 204 and 205 used in the present embodiment, there are an AlGaAs-type laser with a wavelength of 780 nm, an AlGaInP-type laser with a wavelength of 650 nm and a GaN-type laser with a wavelength of 420 nm. By using these lasers in combination, a multi-wavelength semiconductor laser device can be obtained. Furthermore, semiconductor lasers with the same wavelength, for example, an AlGaInP-type high power laser and an AlGaInP-type self-oscillation laser both having a wavelength of 650 nm also may be used.

In (Table 1) below, the relationship between the specific combinations of the semiconductor laser elements 202, 203, 204, 205 and optical discs capable of reading and writing will be shown.

TABLE 1

| 202 | 203 | 204 | 205 | applicable optical discs |
|---|---|---|---|---|
| wavelength: 650 nm power 5 mW | wavelength: 780 nm power: 100 mW | wavelength: 780 nm power: 5 mW | wavelength: 410 nm power: 5 mW | CD, CD-RW, DVD-ROM, HD-DVD-ROM |
| wavelength: 650 nm power: 5 mW | wavelength: 650 nm power: 100 mW | wavelength: 780 nm power: 5 mW | wavelength: 410 nm power: 5 mW | CD, DVD-ROM, DVD-RAM HD-DVD-ROM |
| wavelength: 650 nm power: 5 mW | wavelength: 650 nm power: 100 mW | wavelength: 780 nm power: 5 mW | wavelength: 780 nm power: 100 mW | CD, CD-RW, DVD-ROM, DVD-RAM |
| wavelength: | wavelength: | wavelength: | wavelength: | CD, DVD-ROM, |

TABLE 1-continued

| 202 | 203 | 204 | 205 | applicable optical discs |
|---|---|---|---|---|
| 650 nm power: 5 mW | 780 nm power: 5 mW | 410 nm power: 5 mW | 410 nm power: 30 mW | HD-DVD-RAM |

An optical pickup device including the semiconductor device 201 as the semiconductor laser device is the same as that in the first Embodiment. That is, in the configuration of this optical pickup device, the semiconductor device 201 capable of reducing the interval of the emission points between the plurality of semiconductor laser elements is used as the semiconductor laser element, so that the optical system such as the lens can be simplified even more. As a result, inexpensive optical pickup devices can be realized.

[Third Embodiment]

Figure 8:
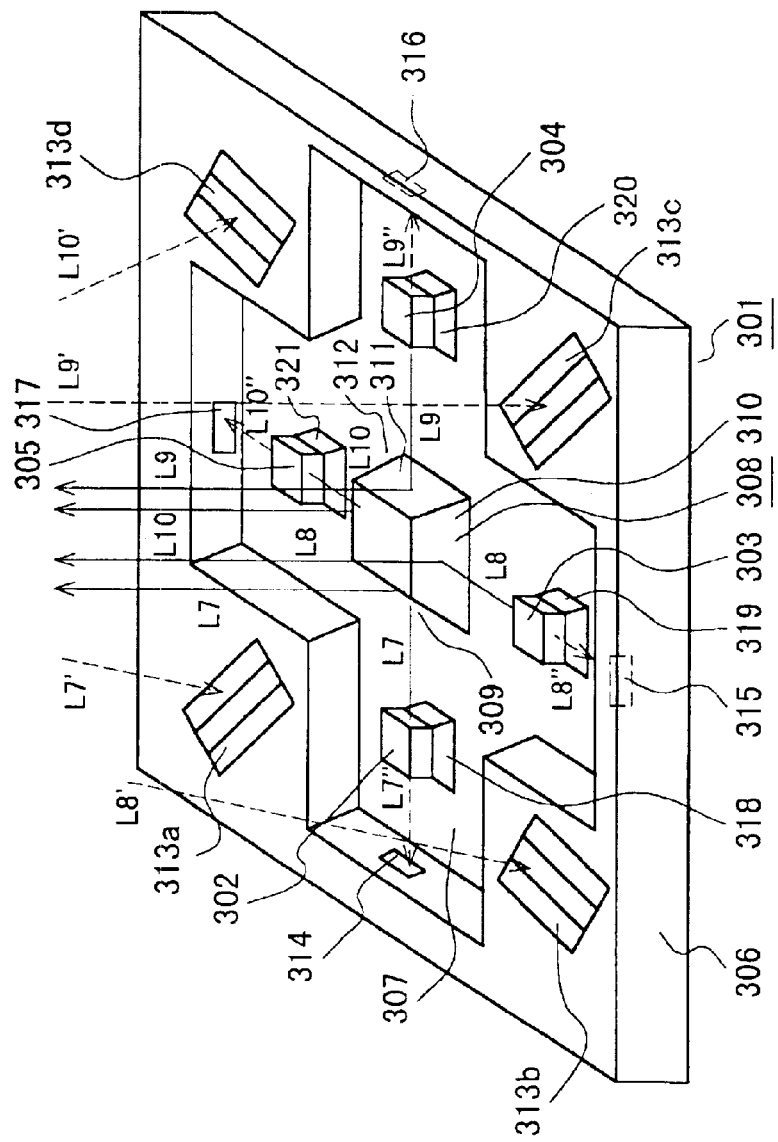
FIG. 8 is a perspective view showing a semiconductor device according to a third embodiment of the present invention.

FIG. 8 is a perspective view showing a semiconductor device according to a third embodiment of the present invention.

As shown in FIG. 8, in the semiconductor device 301 of the present embodiment, a concave portion 307 of 200 μm in depth is formed on the principal plane of a silicon substrate 306, which is a (1 0 0) 9.7° off plane. The concave portion 307 includes a cruciform bottom face, each side having a length of 0.5 mm, and twelve slanted faces surrounding the bottom face. The bottom face included in the concave portion 307 is a (100) 9.7° off plane, and twelve sides forming the bottom face are parallel to the <1 1 0> direction or to the <1 $\bar{1}$ 0> direction. Furthermore, the twelve slanted faces (hereinafter, these slanted faces will be referred to as "outside faces") consist of three different kinds of planes having an angle of 45° with respect to the (1 1 1) plane and the (100) 9.7° off plane.

A protrusion 308 having a quadrangular truncated pyramidal shape of 200 μm in height is formed near the center of the concave portion 307. The protrusion 308 includes a square bottom face, four slanted faces and a top face. Four sides forming the bottom face are parallel to the <1 1 0> direction or to the <1 $\bar{1}$ 0> direction. Moreover, the four slanted faces included in the protrusion 308 are a (1 1 1) inner face, an α inner face, a β inner face and a γ inner face. The top face included in the protrusion 308 is a (1 0 0) 9.7° off plane, and each side of the top face is 50 μm in length.

The (1 1 1) inner face and the β inner face, the β inner face and the γ inner face included in the protrusion 308 are reflecting mirror surfaces 309, 310, 311 and 312. On top of small protrusions 318, 319, 320 and 321 formed on the concave portion 307, semiconductor laser elements 302, 303, 304, and 305 are fixed respectively. The semiconductor laser elements 302, 303, 304 and 305 are arranged such that their front end faces are parallel to the four sides of the protrusion 308 respectively and are opposed to the reflecting mirror surfaces 309, 310, 311 and 312 respectively. Furthermore, on the periphery of the concave portion 307, photodetectors 313a to 313d for receiving light beams L7', L8', L9' and L10' returning from an optical disc are provided. Each of the photodetectors 313a to 313d has light-receiving areas divided into three long and thin portions in the direction from the protrusion 308 toward the respective photodetectors 313a to 313d. By dividing the photodetectors 313a to 313d into three long and thin portions, a tracking error detection by the three beam method can be applied, so that a tracking detection can be performed with high accuracy. On the four outside faces opposed to each of the semiconductor laser elements 302, 303, 304 and 305 respectively, monitoring photodetectors 314, 315, 316 and 317 are disposed. The monitoring photodetectors 314, 315, 316 and 317 respectively are disposed to monitor the power of monitor light beams L7", L8", L9"and L10" emitted from the back end faces of the semiconductor laser elements 302, 303, 304 and 305 and to control the power of the main beams emitted from the front end faces of the semiconductor laser elements 302, 303, 304 and 305.

In addition, the protrusion 308 and the small protrusions 318, 319, 320 and 321 can be formed by forming a mask on the silicon substrate 306 and performing a reactive ion etching (RIE: Reactive Ion Etching). Furthermore, the shape of the small protrusions 318, 319, 320 and 321 is similar to that of the protrusion 308, and each small protrusion is 50 μm in height.

The semiconductor laser elements 302, 303, 304 and 305 are fixed by a solder material (not shown) such that the sides of the crystal growth faces (the sides of the emission parts) face downward.

As in the first embodiment, an Au film (not shown) with a thickness between 300 nm and 500 nm is formed on the reflecting mirror surfaces 309, 310, 311 and 312, and the reflectivity of the reflecting mirror surfaces 309, 310, 311 and 312 is 90% or higher. According to this configuration, main beams L7, L8, L9 and L10 emitted from the front end faces of the semiconductor laser elements 302, 303, 304 and 305 in the horizontal direction respectively are reflected at the reflecting mirror surfaces 309, 310, 311 and 312 and move in the direction of an optical disc (not shown) located in the vertical direction or almost in the vertical direction to the principal plane of the silicon substrate 306, and then are reflected by the optical disc. Then, the light beams L7', L8', L9' and L10' returning from the optical disc enter the photodetectors 313a to 313d respectively, and they are detected as signals.

According to the present embodiment, the semiconductor laser element 302 and the semiconductor laser element 304 can be arranged on a straight line, and the semiconductor laser element 303 and the semiconductor laser element 305 can be arranged on a straight line. Thus, the interval of the emission points between the plurality of semiconductor laser elements can be reduced.

In particular, it is possible to make the incident angles formed by the main beams L7, L8, L9 and L10 of the semiconductor laser elements 302, 303, 304 and 305 with the side faces of the protrusion 308 become closer to 45o respectively.

As examples of the semiconductor laser elements 302, 303, 304 and 305 used in the present embodiment, there are an AlGaAs-type laser with a wavelength of 780 nm, an AlGaInP-type laser with a wavelength of 650 nm and a GaN-type laser with a wavelength of 420 nm. By using these lasers in combination, a multi-wavelength semiconductor laser device can be obtained. Furthermore, semiconductor lasers with the same wavelength, for example, an AlGaInP-type high power laser and an AlGaInP-type self-oscillation laser both having a wavelength of 650 nm, or an AlGaAs-type high power laser and an AlGaAs-type self-oscillation laser both having a wavelength of 780 nm also may be used.

In (Table 2) below, the relationship between the specific combinations of the semiconductor laser elements 302, 303, 304, 305 and optical discs capable of reading and writing will be shown.

TABLE 2

| 302 | 303 | 304 | 305 | applicable optical discs |
|---|---|---|---|---|
| wavelength: 650 nm | wavelength: 780 nm | wavelength: 780 nm | wavelength: 410 nm | CD, CD-RW, DVD-ROM, HD-DVD-ROM |
| power 5 mW | power: 100 mW | power: 5 mW | power: 5 mW | |
| wavelength: 650 nm | wavelength: 650 nm | wavelength: 780 nm | wavelength: 410 nm | CD, DVD-ROM, DVD-RAM HD-DVD-ROM |
| power: 5 mW | power: 100 mW | power: 5 mW | power: 5 mW | |
| wavelength: 650 nm | wavelength: 650 nm | wavelength: 780 nm | wavelength: 780 nm | CD, CD-RW, DVD-ROM, DVD-RAM |
| power: 5 mW | power: 100 mW | power: 5 mW | power: 100 mW | |
| wavelength: 650 nm | wavelength: 750 nm | wavelength: 410 nm | wavelength: 410 nm | CD, DVD-ROM, HD-DVD-RAM |
| power: 5 mW | power: 5 mW | power: 5 mW | power: 30 mW | |

Next, an optical pickup device including the semiconductor device 301 described above as the semiconductor laser device will be described with reference to FIG. 9. The basic configuration of this optical pickup device is the same as that in the first Embodiment.

As shown in FIG. 8 and FIG. 9, in this optical pickup device, a hologram element 324 and a collimator lens 325 are arranged in this order along the main beams L7, L8, L9 and L10 that are emitted from the semiconductor device 301. The hologram element 324 and the collimator lens 325 are arranged such that the main beams L7, L8, L9 and L10 are focused on an optical disc 326. The semiconductor device 301 is mounted inside a case 322 and sealed with a cover glass 323. Then, the light beam returning from the optical disc 326 passes through the collimator lens 325 and the hologram element 324 in this order and enters the semiconductor device 301 again. This light beam is detected by the photodetectors 313a to 313d as information of the optical disc 326.

As shown in FIG. 10A, on the side facing the semiconductor device 301, the hologram element 324 is provided with a diffraction grating 327 for diverging the main beams L7, L8, L9 and L10 respectively into the zero-order, the + first-order and the − first-order diffracted light beams. Furthermore, as shown in FIG. 10B, on the side facing the optical disc 326, the hologram element 324 is provided with a diffraction grating 328 for leading the return light beams L7', L8', L9', and L10' respectively to each of the photodetectors 313a to 313d.

In the configuration of this optical pickup device, the semiconductor device 301 capable of reducing the interval of the emission points between the plurality of semiconductor laser elements is used, so that the optical system such as the lens can be simplified even more. As a result, inexpensive optical pickup devices can be realized.

Figure 11:
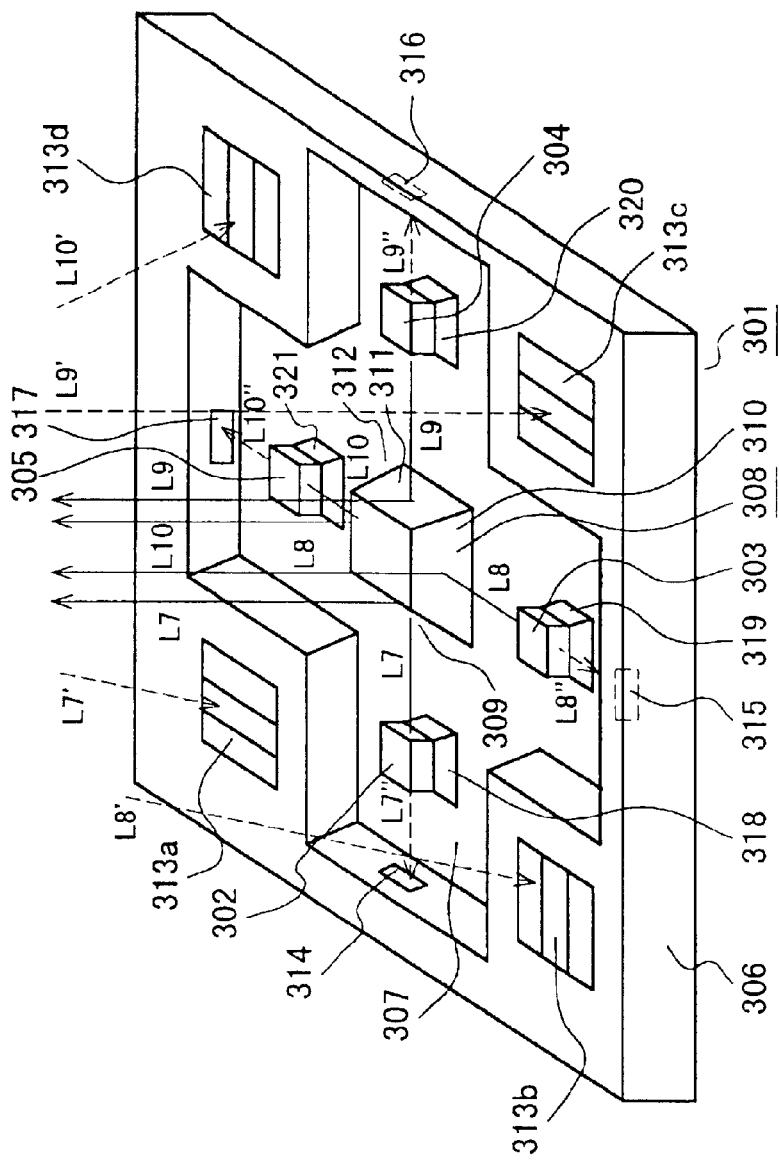
FIG. 11 is a perspective view showing another example of a semiconductor device according to the third embodiment of the present invention.

Additionally, in the present embodiment, each of the photodetectors 313a to 313d is configured to have light-receiving areas divided into three long and thin portions in the direction from the protrusion 308 toward the respective photodetectors 313a to 313d. However, it is not necessarily limited to this configuration. For example, as shown in FIG. 11, each of the photodetectors 313a to 313d may be arranged such that this divided direction is extending along each end face of the semiconductor laser elements 302, 303, 304 and 305 or is parallel to each end face thereof. According to this configuration, even if the positions where the semiconductor laser elements 302, 303, 304 and 305 are mounted are shifted, the light beams L7', L8', L9' and L10' returning from the optical disc are shifted only in the divided direction of the photodetectors 313a to 313d, and the quantity of the return light beams L7', L8', L9' and L10' entering the respective photodetectors 313a to 313d scarcely changes. In other words, by arranging the photodetectors 313a to 313d in the manner shown in FIG. 11, the requirement of the optical pickup device with respect to assembly accuracy can be relieved. As a result, the assembly yield of the optical pickup device can be improved.

Figure 12A:
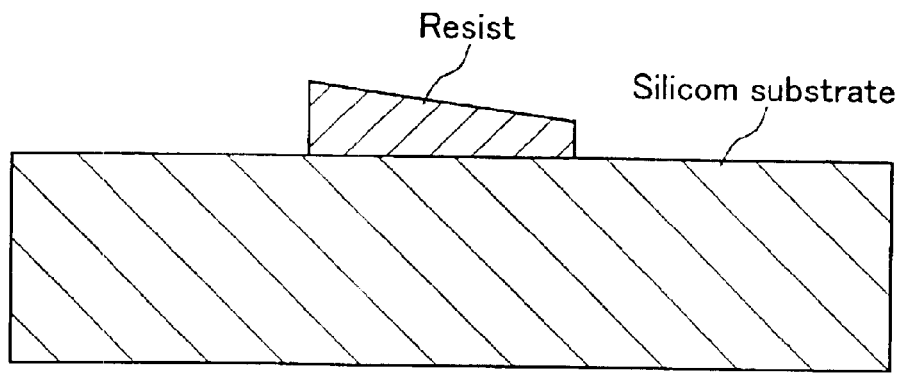
FIG. 12 are sectional views showing the step of forming a reflecting mirror surface onto a silicon substrate according to the third embodiment of the present invention.
Figure 12B:
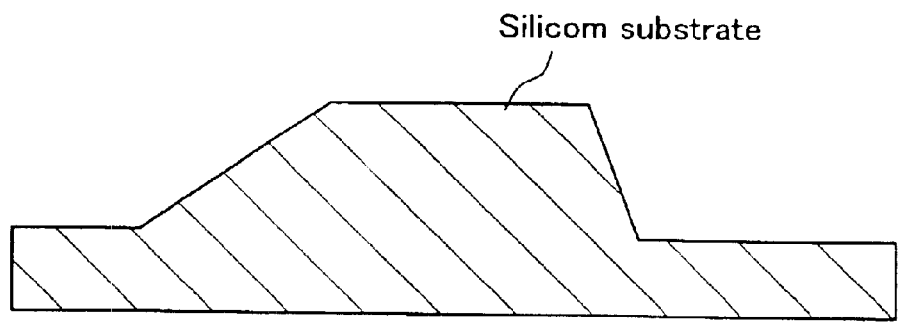
Figure 13A:
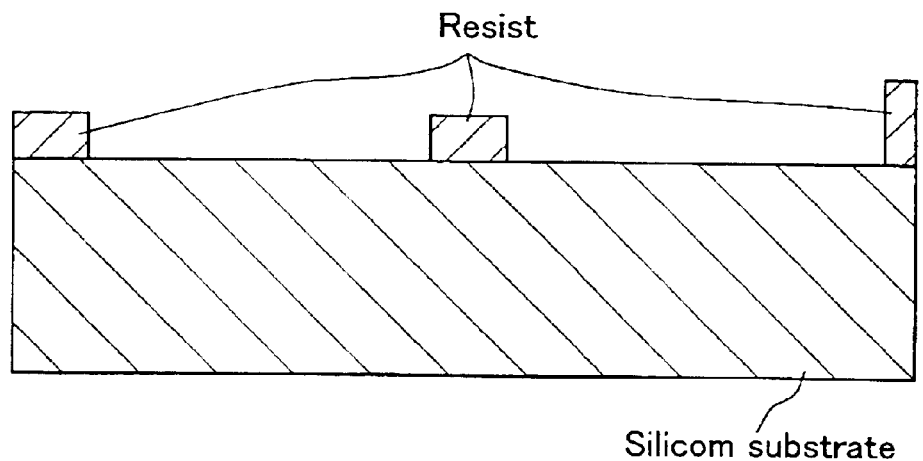
FIG. 13 are sectional views showing another example of the step of forming a reflecting mirror surface onto a silicon substrate according to the third embodiment of the present invention.
Figure 13B:
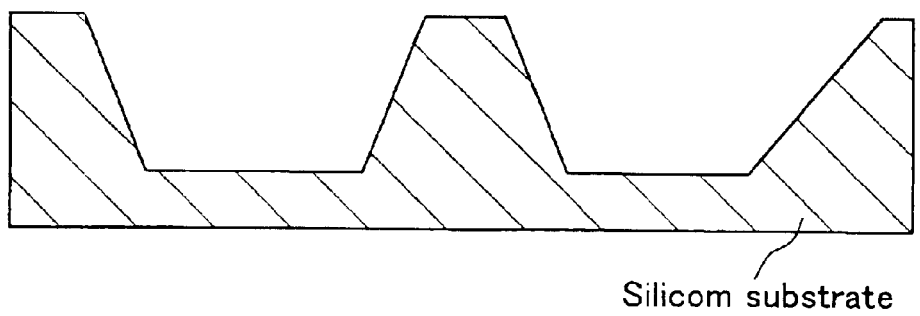
Figure 14:
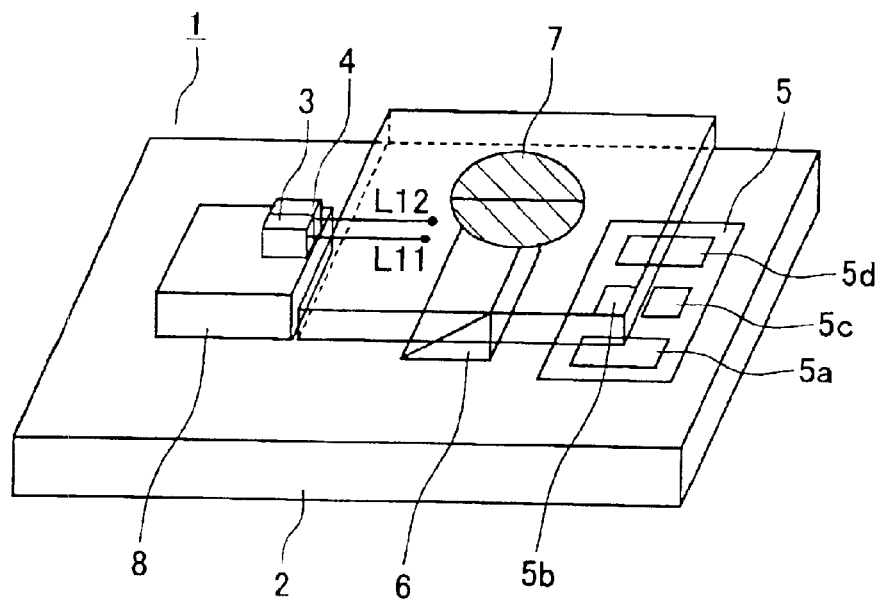
FIG. 14 is a perspective view showing a conventional semiconductor device.
Figure 15:
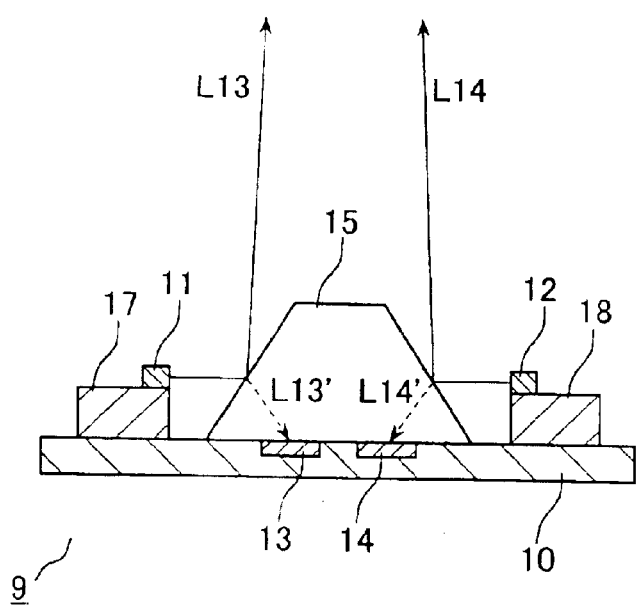
FIG. 15 is a sectional view showing another example of a conventional semiconductor device.

Furthermore, in the first embodiment to the third embodiment, the silicon substrate with the principal plane of a (1 0 0) 9.7° off plane is used, but it is not necessarily limited to this configuration. In particular, when the concave portion, the protrusion and the small protrusions are formed by the reactive ion etching, the same effect can be obtained by using a silicon substrate with the principal plane of a (1 0 0) plane without an off angle instead. In addition, at the time when this reactive ion etching is performed, by changing the thickness of the resist to be formed as the mask on the substrate inside the plane as shown in FIG. 12A and FIG. 13A, the angles of the reflecting mirror surfaces can be varied as shown in FIG. 12B and FIG. 13B. Accordingly, the angles of the reflecting mirror surfaces can be adjusted as designed.

Furthermore, in the first embodiment to the third embodiment, the protrusion having a quadrangular truncated pyramidal shape is used, but the shape of the protrusion is not necessarily limited thereto. For example, by using a protrusion having a triangular truncated pyramidal shape or a hexagonal truncated pyramidal shape etc., the semiconductor laser elements may be arranged so as to face each of the side faces included in the protrusion. In particular, in the third embodiment, a protrusion with sharp points such as a triangular pyramid, a quadrangular pyramid and a hexagonal pyramid may be used.

Furthermore, in the first embodiment to the third embodiment, the bottom face included in the concave portion was described by referring to the examples in which the bottom face is a square or a cruciform, but it is not necessarily limited to this configuration. The bottom face included in the concave portion may have, for example, a rectangle shape, a hexagon shape, an octagon shape and the like.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A semiconductor device comprising:
   a substrate, the substrate including a protrusion having a plurality of side faces formed from the substrate by working upon the substrate, and
   a plurality of semiconductor laser elements disposed on the substrate, wherein the plurality of semiconductor laser elements is arranged such that each end face thereof is opposed to a different side face of the protrusion, and the side faces opposed to the plurality of semiconductor laser elements include a reflective surface, each reflective surface being a surface of the substrate and being configured to reflect a laser beam emitted from the opposing semiconductor laser element.

2. The semiconductor device according to claim 1, wherein the protrusion is formed into a truncated pyramidal shape, and a photodectector is disposed on a top face of the protrusion.

3. The semiconductor device according to claim 1, further comprising a plurality of small protrusions formed on the substrate by processing the substrate, with the semiconductor laser elements mounted on each of the small protrusions.

4. The semiconductor device according to claim 1, wherein a groove is formed between the semiconductor laser element and the side face of the protrusion on the substrate.

5. The semiconductor device according to claim 1, wherein the protrusion has four side faces having an angle between 40° and 50° with respect to a principal plane of the substrate, and the semiconductor laser elements are arranged such that emitting end faces for main beams are opposed to the side faces of the protrusion.

6. The semiconductor device according to claim 1, wherein the substrate is a silicon substrate, and a principal plane of the substrate is a (1 0 0) plane inclined at an angle in the range between 5° and 15° in a <1 $\bar{1}$ 0> direction, and one of the side faces of the protrusion opposed to the emitting end faces for main beams of the semiconductor laser elements is a (1 1 1) plane.

7. The semiconductor device according to claim 1, wherein the substrate is a silicon substrate, and a principal plane of the substrate is a (5 1 1) plane inclined at an angle in the range between 1° and 11° in a <1 $\bar{1}$ 0>direction, and one of the side faces of the protrusion opposed to the emitting end faces for main beams of the semiconductor laser elements is a (1 1 1) plane.

8. The semiconductor device according to claim 1, further comprising a concave portion having a plurality of side faces formed on the substrate by processing the substrate, wherein the protrusion and the plurality of semiconductor laser elements are disposed inside the concave portion.

9. The semiconductor device according to claim 8, wherein the plurality of semiconductor laser elements is arranged such that each end face on an opposite side of the end faces opposed to the side faces of the protrusion is opposed to a different side face of the concave portion.

10. The semiconductor device according to claim 9, wherein a main beam is emitted from one end face of the semiconductor laser element and a monitor light beam is emitted from the other end face thereof, and a monitoring photodetector for receiving the monitor light beam is provided on the side face of the protrusion or the side face of the concave portion opposed to the emitting end face of the monitor light beam.

11. The semiconductor device according to claim 8, wherein the photodetector is provided on the periphery of the concave portion.

12. The semiconductor device according to claim 11, wherein the photodetector has light-receiving areas divided into a plurality of portions.

13. The semiconductor device according to claim 12, wherein the photodetector is divided in the direction parallel to the end face of the semiconductor laser element.

14. The semiconductor device according to claim 8, wherein a groove is formed between the semiconductor laser element and the side face of the concave portion on the substrate.

15. The semiconductor device according to claim 8, wherein the substrate is a silicon substrate, and a bottom face of the concave portion is a (1 0 0) plane inclined at an angle in the range between 5° and 15° in a <1 $\bar{1}$ 0> direction, and one of the side faces of the concave portion opposed to the emitting end faces for main beams of the semiconductor laser elements is a (1 1 1) plane.

16. The semiconductor device according to claim 8, wherein the substrate is a silicon substrate, and a bottom face of the concave portion is a (5 1 1) plane inclined at an angle in the range between 1° and 11° in a <1 $\bar{1}$ 0> direction, and one of the side faces of the concave portion opposed to the emitting end faces for main beams of the semiconductor laser elements is a (1 1 1) plane.

17. An optical pickup device comprising:

a semiconductor device including a substrate and a plurality of semiconductor laser elements arranged on the substrate;

a hologram element; and a plurality of photodetectors disposed on the substrate, wherein the substrate includes a plurality of reflecting surfaces, the reflecting surfaces being formed from the substrate by working upon the substrate, each of the plurality of semiconductor laser elements is arranged such that emitting end faces of the semiconductor laser elements face a same side of the substrate and each emitting end face is opposed to a different reflecting surface, and the hologram element is positioned along an optical axis of a light beam that has been reflected by one of the plurality of reflecting surfaces toward an optical recording medium, the hologram element being configured to combine reflected light beams and direct them towards the optical recording medium.

18. An optical pickup device comprising a semiconductor device having a plurality of semiconductor laser elements and a hologram element positioned along an optical axis of a light beam emitted from the semiconductor laser element toward an optical recording medium, the semiconductor device comprising:

a substrate, the substrate including a protrusion having a plurality of side faces formed from the substrate by working upon the substrate, and a plurality of semiconductor laser elements disposed on the substrate, wherein the plurality of semiconductor laser elements is arranged such that each end face thereof is opposed to a different side face of the protrusion, and the side faces opposed to the plurality of semiconductor laser elements include a reflective surface, each reflective surface being a surface of the substrate and being configured to reflect a laser beam emitted from the opposing semiconductor laser element.

19. The optical pickup device according to claim 17, wherein the hologram element has a plurality of diffraction gratings, the diffraction gratings being configured to direct light beams towards the optical recording medium or the plurality of photodetectors.

20. The optical pickup device according to claim 18, wherein the hologram element has a plurality of diffraction gratings, the diffraction gratings being configured to direct light beams towards the optical recording medium or the plurality of photodetectors.

* * * * *